US009923542B2

United States Patent
Kikuchi

(10) Patent No.: US 9,923,542 B2
(45) Date of Patent: Mar. 20, 2018

(54) RADIO-FREQUENCY MODULE COMPONENT

(71) Applicant: Murata Manufacturing Co., Ltd., Nagaokakyo-shi, Kyoto-fu (JP)

(72) Inventor: Kenichiro Kikuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 176 days.

(21) Appl. No.: 14/951,748

(22) Filed: Nov. 25, 2015

(65) Prior Publication Data

US 2016/0079952 A1    Mar. 17, 2016

Related U.S. Application Data

(63) Continuation of application No. PCT/JP2014/060245, filed on Apr. 9, 2014.

(30) Foreign Application Priority Data

May 29, 2013   (JP) .................... 2013-112873

(51) Int. Cl.
*H03H 7/46* (2006.01)
*H03F 3/19* (2006.01)
(Continued)

(52) U.S. Cl.
CPC .......... *H03H 7/46* (2013.01); *H01L 23/552* (2013.01); *H01L 23/66* (2013.01); *H03F 3/19* (2013.01);
(Continued)

(58) Field of Classification Search
CPC ...... H03H 7/46; H03H 7/0138; H03H 7/0161; H03H 11/04; H03H 7/463;
(Continued)

(56) References Cited

U.S. PATENT DOCUMENTS

2003/0058063 A1   3/2003   Sheen
2005/0104685 A1   5/2005   Kuroki et al.
(Continued)

FOREIGN PATENT DOCUMENTS

JP   2002-111317 A   4/2002
JP   2003-115737 A   4/2003
(Continued)

OTHER PUBLICATIONS

Official Communication issued in International Patent Application No. PCT/JP2014/060245, dated Jun. 17, 2014.

*Primary Examiner* — Robert J Pascal
*Assistant Examiner* — Kimberly Glenn
(74) *Attorney, Agent, or Firm* — Keating & Bennett, LLP

(57) ABSTRACT

A radio-frequency module component includes a splitter/combiner and a shield case. The splitter/combiner includes a multilayer body, a common input/output electrode, a low-band input/output electrode, a high-band input/output electrode, and outer ground electrodes. The multilayer body includes insulating layers and electrode patterns stacked on each other, and side surfaces opposed to each other. The common input/output electrode is disposed on one of the side surfaces and a bottom surface of the multilayer body. The low-band input/output electrode and the high-band input/output electrode are disposed on another of the side surfaces and the bottom surface of the multilayer body. An additional side surface of the multilayer body opposes a side surface of the shield case in the closest proximity to each other.

20 Claims, 15 Drawing Sheets

(51) Int. Cl.
*H03H 7/01* (2006.01)
*H03H 11/04* (2006.01)
*H03K 17/56* (2006.01)
*H01L 23/552* (2006.01)
*H01L 23/66* (2006.01)
*H03H 1/00* (2006.01)

(52) U.S. Cl.
CPC ........ *H03H 7/0138* (2013.01); *H03H 7/0161* (2013.01); *H03H 7/463* (2013.01); *H03H 11/04* (2013.01); *H03K 17/56* (2013.01); *H01L 2223/6655* (2013.01); *H01L 2223/6677* (2013.01); *H01L 2924/14* (2013.01); *H01L 2924/1421* (2013.01); *H01L 2924/14215* (2013.01); *H01L 2924/15313* (2013.01); *H01L 2924/16251* (2013.01); *H01L 2924/3025* (2013.01); *H03F 2200/451* (2013.01); *H03H 2001/0085* (2013.01)

(58) Field of Classification Search
CPC .......... H03H 2001/0085; H01L 23/552; H01L 23/66; H01L 2223/6655; H01L 2223/6677; H01L 2924/14; H01L 2924/1421; H01L 2924/14215; H01L 2924/15313; H01L 2924/16251; H03F 3/19; H03F 2200/451; H03K 17/56
See application file for complete search history.

(56) References Cited

U.S. PATENT DOCUMENTS

| | | |
|---|---|---|
| 2006/0192632 A1 | 8/2006 | Nakai et al. |
| 2013/0307749 A1 | 11/2013 | Nagai |

FOREIGN PATENT DOCUMENTS

| | | |
|---|---|---|
| JP | 2003-249868 A | 9/2003 |
| JP | 2004-266361 A | 9/2004 |
| JP | 2005-102098 A | 4/2005 |
| JP | 2005-347889 A | 12/2005 |
| JP | 2008-278100 A | 11/2008 |
| JP | 2012-80160 A | 4/2012 |
| WO | 2012/105302 A1 | 8/2012 |

——— WITHOUT CASE
— · — 200 μm
— — - 100 μm
········· 50 μm

RADIO-FREQUENCY MODULE COMPONENT

BACKGROUND OF THE INVENTION

1. Field of the Invention

The present invention relates to a radio-frequency module component including a splitter/combiner.

2. Description of the Related Art

A radio-frequency module component including a splitter/combiner is used in, for example, a wireless communication device. As such a radio-frequency module component, the radio-frequency module component disclosed in Japanese Unexamined Patent Application Publication No. 2003-249868, for example, is available. The radio-frequency module component disclosed in Japanese Unexamined Patent Application Publication No. 2003-249868 includes a substrate, a splitter/combiner, and a shield case. The splitter/combiner is mounted on the substrate. The shield case is disposed over the substrate so as to cover elements mounted on the substrate. The shield case is provided for blocking noise input from the exterior or preventing noise output from the radio-frequency module component from leaking to the exterior.

If a shield case and a splitter/combiner are located close to each other, stray capacitance may be generated between the shield case and an outer electrode of the splitter/combiner, which may deteriorate the filter characteristic of the splitter/combiner. Accordingly, in the radio-frequency module component disclosed in Japanese Unexamined Patent Application Publication No. 2003-249868, the splitter/combiner is separated from the shield case by a predetermined distance.

In this case, however, a wiring pattern for connecting the splitter/combiner and an outer output electrode of the radio-frequency module component is lengthened, thus increasing the transmission loss incurred in the wiring pattern. Additionally, since a space is required between the shield case and the splitter/combiner, the size of the radio-frequency module component is increased.

SUMMARY OF THE INVENTION

Preferred embodiments of the present invention provide a radio-frequency module component in which a filter characteristic of a splitter/combiner is not deteriorated even if the splitter/combiner is located close to a shield case.

A radio-frequency module component according to a preferred embodiment of the present invention includes a splitter/combiner and a shield case. The splitter/combiner includes a multilayer body including a plurality of insulating layers and electrode patterns stacked on each other and which includes first through fourth side surfaces. A common input/output electrode, an individual input/output electrode, and an outer ground electrode are provided on a bottom surface of the splitter/combiner. The splitter/combiner is disposed within the shield case. The first side surface and the second side surface oppose each other. The common input/output electrode is disposed at an edge of the first side surface on the bottom surface. The individual input/output electrode is disposed at an edge of the second side surface on the bottom surface. Among the first through fourth side surfaces, the third or fourth side surface opposes a side surface of the shield case in the closest proximity to each other.

With this unique structure, stray capacitance is not generated between the shield case and each of the common input/output electrode and the individual input/output electrode. Accordingly, even when the splitter/combiner is located close to the shield case, the degree of deterioration in the filter characteristic of the splitter/combiner is merely negligible. Since the splitter/combiner and the shield case may be located close to each other, a space is not required between the splitter/combiner and the shield case. It is thus possible to reduce the size of the radio-frequency module component.

An individual input/output electrode may include a low-band input/output electrode and a high-band input/output electrode. The low-band input/output electrode may be disposed near the third side surface. The high-band input/output electrode may be disposed near the fourth side surface. The splitter/combiner may include a low-band filter circuit and a high-band filter circuit within the multilayer body. The low-band filter circuit may be disposed near the third side surface and may be connected between the common input/output electrode and the low-band input/output electrode. The high-band filter circuit may be disposed near the fourth side surface and may be connected between the common input/output electrode and the high-band input/output electrode. Among the first through fourth side surfaces, the third side surface may oppose a side surface of the shield case in the closest proximity to each other.

With this configuration, stray capacitance is generated between electrode patterns of the low-band filter circuit and the shield case. The device values of the capacitors and inductors of the low-band filter circuit are greater than those of the high-band filter circuit. Accordingly, the influence produced on the low-band filter circuit by stray capacitance is smaller than that on the high-band filter circuit. With the above-described configuration, therefore, the degree of deterioration in the filter characteristic of the splitter/combiner is smaller than that when the fourth side surface opposes a side surface of the shield case in the closest proximity to each other.

A radio-frequency module component according to a preferred embodiment of the present invention may include a substrate with a rectangular or substantially rectangular flat shape to mount the splitter/combiner thereon. Side surfaces of the shield case may be disposed along edges of the substrate. The splitter/combiner may be disposed at one of four corners of the substrate. The first side surface may oppose a side surface of the shield case in closer proximity than the second side surface opposes a side surface of the shield case.

With this configuration, the length of a wiring pattern between the common input/output electrode and an outer output electrode at an edge of the substrate is reduced, thus making it possible to decrease the transmission loss incurred in this wiring pattern. Additionally, by utilizing stray capacitance generated between the common input/output electrode and the shield case, a matching circuit is able to be designed.

The common input/output electrode may preferably extend from the bottom surface to the first side surface, and the outer ground electrode may preferably extend from the bottom surface to one of the first through fourth side surfaces.

With this configuration, too, even when the splitter/combiner is located close to the shield case, the degree of deterioration in the filter characteristic of the splitter/combiner is merely negligible.

The first side surface may preferably oppose a side surface of the shield case such that they are separated from each other preferably by about 200 μm or greater, for example.

With this configuration, even when the splitter/combiner is located close to the shield case, the deterioration in the filter characteristic of the splitter/combiner is further reduced or prevented.

A resin may preferably fill a portion between the splitter/combiner and the shield case, and the shield case may preferably be made of a metal.

When a resin fills a portion between opposing electrodes, the electrostatic capacitance generated between the opposing electrodes is higher than when air fills a portion between the opposing electrodes. Thus, in this configuration, the advantages of various preferred embodiments of the present invention are more noticeable.

According to various preferred embodiments of the present invention, the filter characteristic of a splitter/combiner is not deteriorated even if the splitter/combiner is located close to a shield case.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
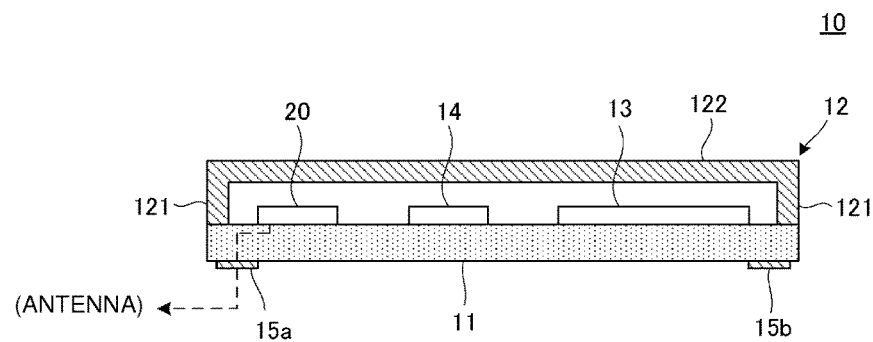
FIG. 1 is a side sectional view of the major portion of a radio-frequency module component 10.

A radio-frequency module component 10 according to a first preferred embodiment of the present invention will be described below. The radio-frequency module component 10 is used in, for example, a wireless communication device. FIG. 1 is a side sectional view of the major portion of the radio-frequency module component 10. The radio-frequency module component 10 includes a substrate 11, a shield case 12, a RFIC (Radio Frequency Integrated Circuit) 13, a radio-frequency element 14, outer output electrodes 15a and 15b, and a splitter/combiner 20. The radio-frequency element 14 is, for example, a switch IC, a power amplifier, a low-noise amplifier, or a filter.

On a first main surface of the substrate 11 which preferably has a rectangular or substantially rectangular flat shape, the RFIC 13, the radio-frequency element 14, and the splitter/combiner 20 are mounted. The splitter/combiner 20 is disposed near an edge of the substrate 11. The shield case 12 is a lid metal and includes side surface portions 121 defining a frame shape and a bottom surface portion 122 with a rectangular or substantially rectangular flat shape. The shield case 12 is provided to block noise input from the exterior and prevent noise output from the elements mounted on the substrate 11 from leaking to the exterior. The side surface portions 121 of the shield case 12 are disposed along the edges of the substrate 11 so as to define a housing by the substrate 11 and the shield case 12. The RFIC 13, the radio-frequency element 14, and the splitter/combiner 20 are disposed within this housing. The splitter/combiner 20 and the shield case 12 are located close to each other.

At edges of a second main surface of the substrate 11, the outer output electrodes 15a and 15b are provided. The splitter/combiner 20 and the outer output electrode 15a are close to each other, as viewed from a direction perpendicular to the first main surface of the substrate 11. The splitter/combiner 20 is connected to an antenna via the outer output electrode 15a.

With this configuration, the length of the wiring pattern to connect the splitter/combiner 20 and the outer output electrode 15a is reduced, thus making it possible to decrease the transmission loss incurred in this wiring pattern. Additionally, a space is not required between the splitter/combiner 20 and the shield case 12, thus making it possible to reduce the size of the radio-frequency module component.

Figure 2:
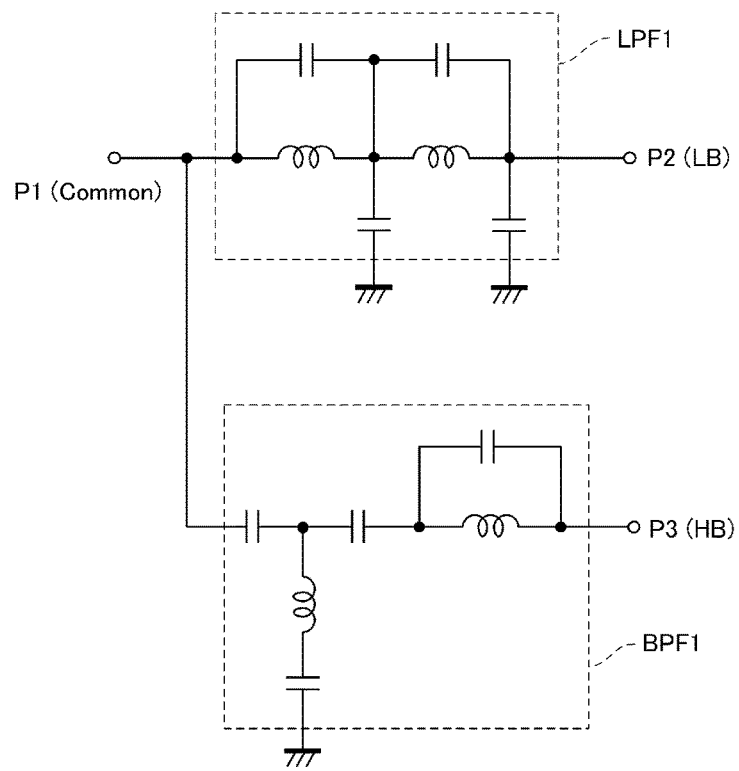
FIG. 2 is an equivalent circuit diagram of a splitter/combiner 20.

FIG. 2 is an equivalent circuit diagram of the splitter/combiner 20. The splitter/combiner 20 includes a low-pass filter LPF1, a band pass filter BPF1, a common input/output terminal P1, a low-band input/output terminal P2, and a high-band input/output terminal P3. The low-pass filter LPF1 corresponds to a low-band filter circuit according to a preferred embodiment of the present invention. The band pass filter BPF1 corresponds to a high-band filter circuit according to a preferred embodiment of the present invention.

The low-pass filter LPF1 is connected between the common input/output terminal P1 and the low-band input/output terminal P2. The band pass filter BPF1 is connected between the common input/output terminal P1 and the high-band input/output terminal P3. A low-band radio-frequency signal is transmitted between the common input/output terminal P1 and the low-band input/output terminal P2. A high-band radio-frequency signal is transmitted between the common input/output terminal P1 and the high-band input/output terminal P3. The common input/output terminal P1 is connected to an antenna (not shown), and the low-band input/output terminal P2 and the high-band input/output terminal P3 are connected to the RFIC (not shown) or the radio-frequency element (not shown).

Figure 3A:
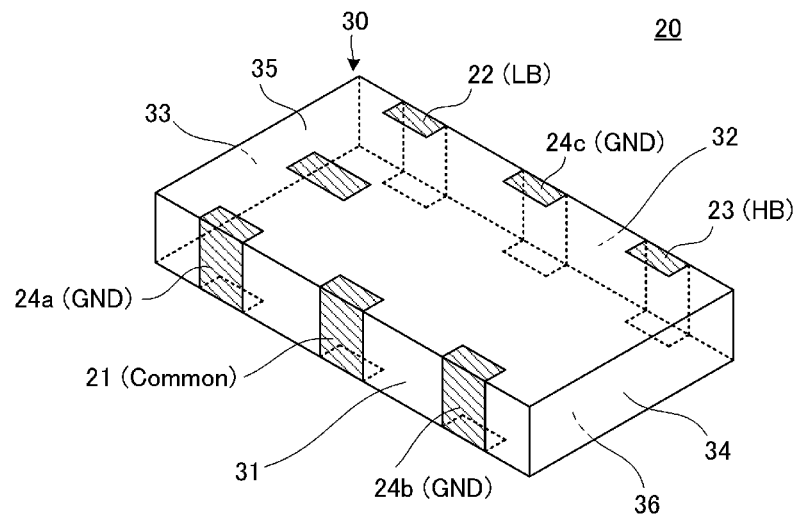
FIG. 3A is an external perspective view of the splitter/combiner 20 and FIG. 3B is a bottom view of the splitter/combiner 20.
Figure 3B:
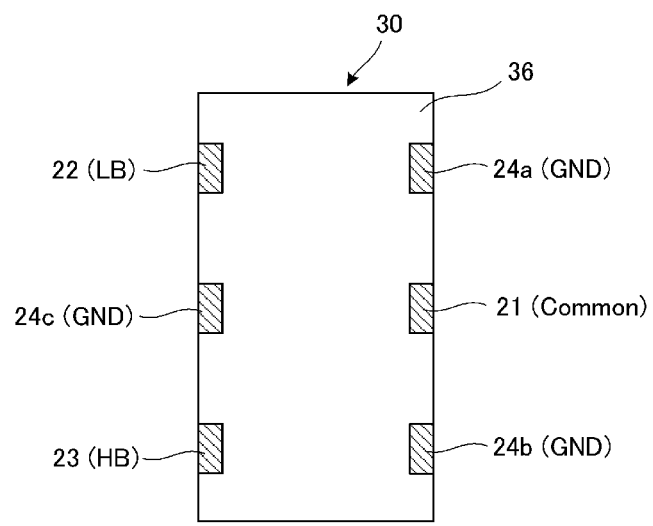

FIG. 3A is an external perspective view of the splitter/combiner 20. FIG. 3B is a bottom view of the splitter/combiner 20. The splitter/combiner 20 includes a common input/output electrode 21, a low-band input/output electrode 22, a high-band input/output electrode 23, outer ground electrodes 24a through 24c, and a multilayer body 30. The low-band input/output electrode 22 and the high-band input/output electrode 23 define an individual input/output electrode according to a preferred embodiment of the present invention.

The common input/output electrode 21 corresponds to the common input/output terminal P1 shown in FIG. 2. The low-band input/output electrode 22 corresponds to the low-band input/output terminal P2 shown in FIG. 2. The high-band input/output electrode 23 corresponds to the high-band input/output terminal P3 shown in FIG. 2.

The multilayer body 30 includes a plurality of insulating layers and electrode patterns stacked on each other. The multilayer body 30 preferably has a rectangular or substantially rectangular parallelepiped shape, and includes a top surface 35 and a bottom surface 36 which are perpendicular to the stacking direction and side surfaces 31 through 34 which are parallel with the stacking direction. The side surfaces 31 and 32 oppose each other, while the side surfaces 33 and 34 oppose each other. The side surfaces 31 and 32 are parallel with the longitudinal direction of the top surface 35. The side surfaces 33 and 34 are parallel or substantially parallel with the widthwise direction of the top surface 35. The side surface 31 is a first side surface. The side surface 32 is a second side surface. The side surface 33 is a third side surface. The side surface 34 is a fourth side surface.

The common input/output electrode 21 and the outer ground electrodes 24a and 24b are provided on the side surface 31 of the multilayer body 30 such that they are separated from each other by a predetermined distance. The common input/output electrode 21 is disposed between the outer ground electrodes 24a and 24b. The low-band input/output electrode 22, the high-band input/output electrode 23, and the outer ground electrode 24c are provided on the side surface 32 of the multilayer body 30 such that the low-band input/output electrode 22 opposes the outer ground electrode 24a, the high-band input/output electrode 23 opposes the outer ground electrode 24b, and the outer ground electrode 24c opposes the common input/output electrode 21. The low-band input/output electrode 22 is disposed closer to the side surface 33, while the high-band input/output electrode 23 is disposed closer to the side surface 34. The common input/output electrode 21, the low-band input/output electrode 22, the high-band input/output electrode 23, and the outer ground electrodes 24a through 24c start from the top surface 35, pass through the side surface 31 or 32, and extend to the bottom surface 36 of the multilayer body 30.

It is not always necessary that the common input/output electrode 21, the low-band input/output electrode 22, the high-band input/output electrode 23, and the outer ground electrodes 24a through 24c be provided on the side surfaces 31 through 34 and the top surface 35. Instead, they may be provided only on the bottom surface 36, as indicated by the arrangement shown in FIG. 3B.

Figure 4:
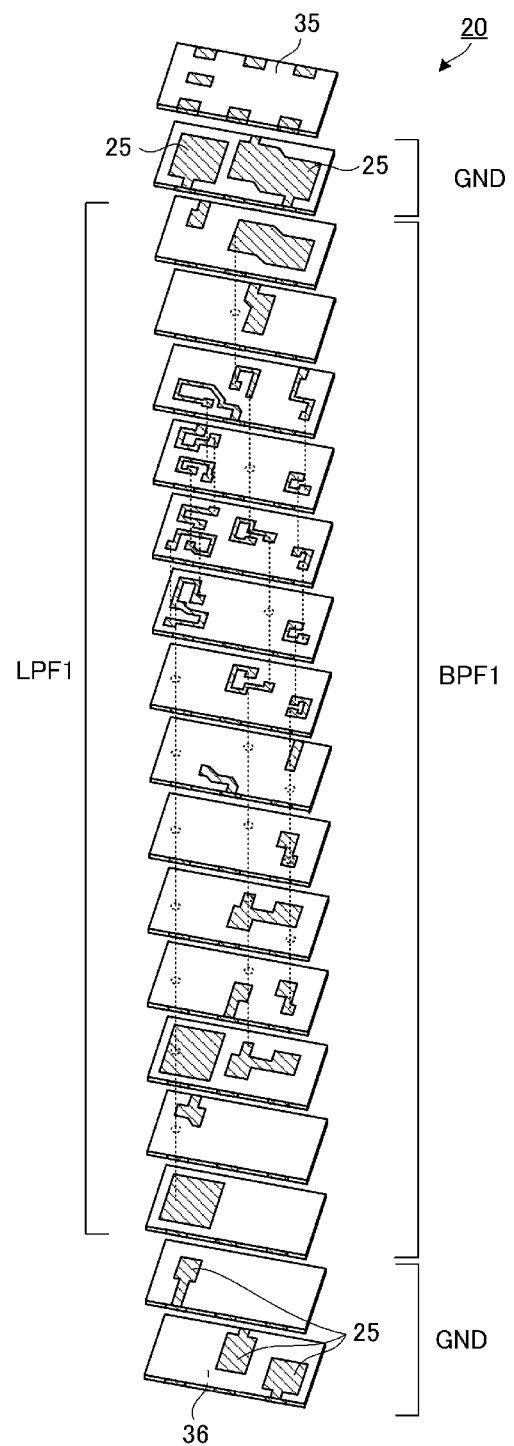
FIG. 4 is an exploded perspective view of the splitter/combiner 20.

FIG. 4 is an exploded perspective view of the splitter/combiner 20. Linear electrode patterns provided on the insulating layers are connected to each other by using via-conductors so as to define inductors. Planar electrode patterns provided on the insulating layers oppose each other with insulating layers interposed therebetween so as to define capacitors.

At a first end portion (side surface 33) in the longitudinal direction of the top surface 35, electrode patterns forming the low-pass filter LPF1 are principally provided. At a second end portion (side surface 34) in the longitudinal direction of the top surface 35, electrode patterns forming the band pass filter BPF1 are principally provided. With this arrangement, the electrode patterns of the low-pass filter LPF1 do not overlap the electrode patterns of the band pass filter BPF1, as viewed from the stacking direction. It is thus possible to significantly reduce or prevent electromagnetic coupling between the low-pass filter LPF1 and the band pass filter BPF1.

As a result, the isolation characteristics of the splitter/combiner 20 are improved.

At a first end portion (top surface 35) in the stacking direction, linear electrode patterns forming inductors are principally provided. At a second end portion (bottom surface 36) in the stacking direction, planar electrode patterns defining capacitors are principally provided. With this arrangement, it is possible to reduce the possibility that the planar electrode patterns will interfere with magnetic fields generated around the linear electrode patterns. Thus, the Q factor of the splitter/combiner 20 is improved.

Ground electrodes 25 are provided near the topmost insulating layer and the bottommost insulating layer such that they sandwich the electrode patterns along the stacking direction. The ground electrodes 25 are planar or substantially planar electrode patterns and are connected to the outer ground electrodes 24a through 24c. Advantages obtained by disposing the ground electrodes 25 will be discussed later.

Figure 5:
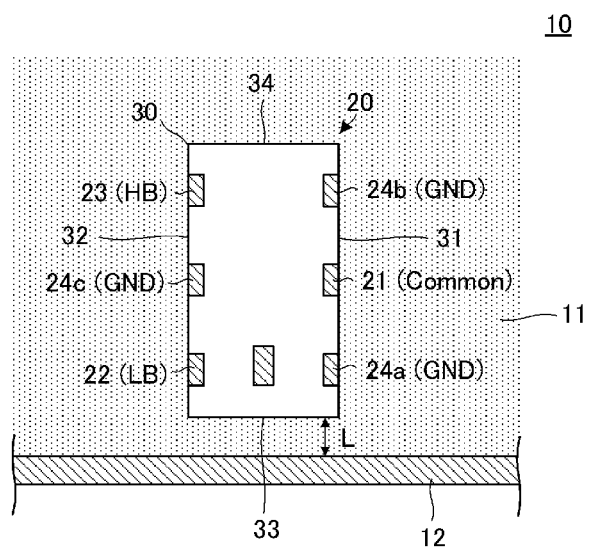
FIG. 5A is a sectional plan view of the major portion of the radio-frequency module component 10 and FIG. 5B is a sectional plan view of the major portion of a radio-frequency module component 40.

FIG. 5A is a sectional plan view of the major portion of the radio-frequency module component 10. The splitter/combiner 20 is located close to the shield case 12. Among the side surfaces 31 through 34 of the splitter/combiner 20, the side surface 33 opposes the side surface of the shield case 12 in the closest proximity to each other. The side surface of the splitter/combiner 20 is separated from the side surface of the shield case 12 by a distance L. No elements are disposed between the side surface 33 of the splitter/combiner 20 and the side surface of the shield case 12. By abutting the bottom surface 36 (see FIGS. 3A and 3B) of the splitter/combiner 20 against the substrate 11, the splitter/combiner 20 is mounted on the substrate 11.

Figure 5B:
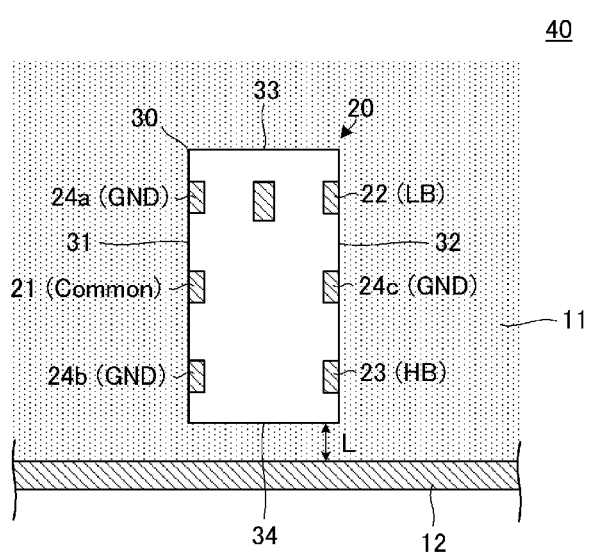

The splitter/combiner 20 may be disposed, as shown in FIG. 5B. FIG. 5B is a sectional plan view of the major portion of a radio-frequency module component 40. Among the side surfaces 31 through 34 of the splitter/combiner 20, the side surface 34 opposes the side surface of the shield case 12 in the closest proximity to each other. The configuration of the radio-frequency module component 40 other than this point is similar to that of the radio-frequency module component 10.

Figure 6A:
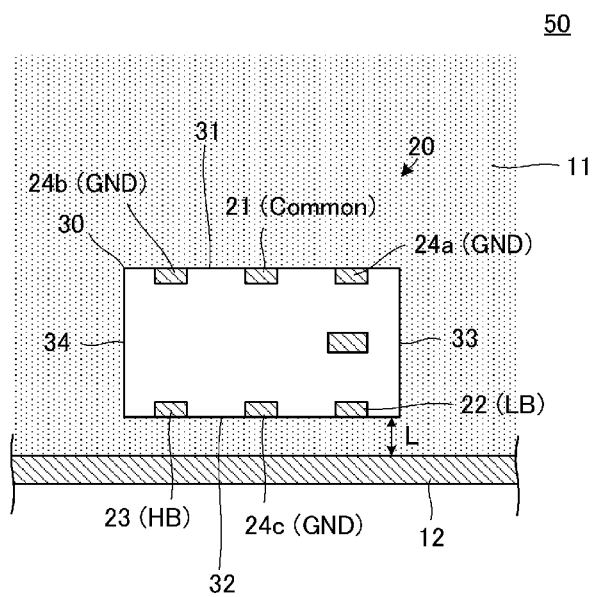
FIG. 6A is a sectional plan view of the major portion of a radio-frequency module component 50 and FIG. 6B is a sectional plan view of the major portion of a radio-frequency module component 51.
Figure 6B:
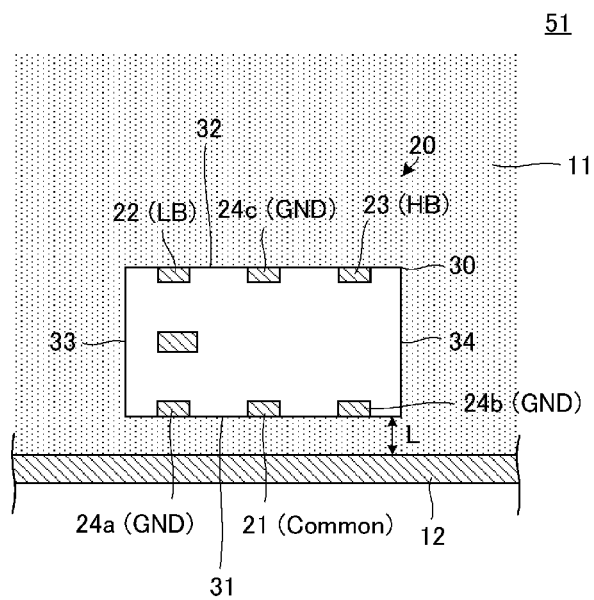

Radio-frequency module components 50 and 51, which serve as comparative examples, will now be discussed below. FIG. 6A is a sectional plan view of the major portion of the radio-frequency module component 50. FIG. 6B is a sectional plan view of the major portion of the radio-frequency module component 51.

In the radio-frequency module component 50, among the side surfaces 31 through 34 of the splitter/combiner 20, the side surface 32 opposes the side surface of the shield case 12 in the closest proximity to each other. The configuration of the radio-frequency module component 50 other than this point is similar to that of the radio-frequency module component 10.

In the radio-frequency module component 51, among the side surfaces 31 through 34 of the splitter/combiner 20, the side surface 31 opposes the side surface of the shield case 12 in the closest proximity to each other. The configuration of the radio-frequency module component 51 other than this point is similar to that of the radio-frequency module component 10.

Figure 7A:
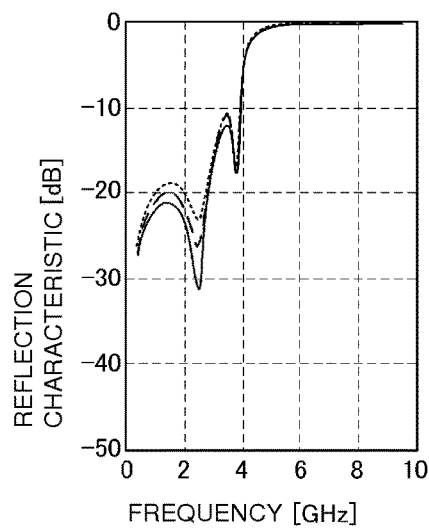
FIGS. 7A-7C are diagrams illustrating reflection characteristics of the splitter/combiner 20 of the radio-frequency module component 50.
Figure 7B:
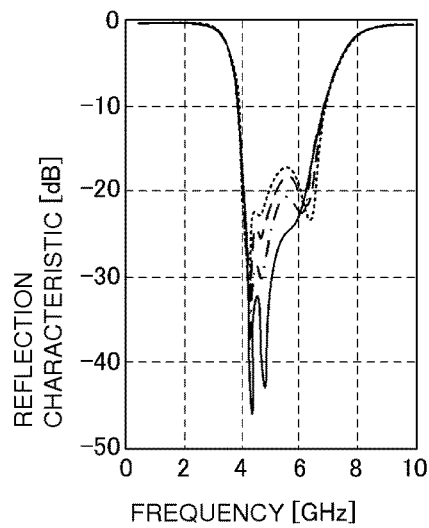
Figure 7C:
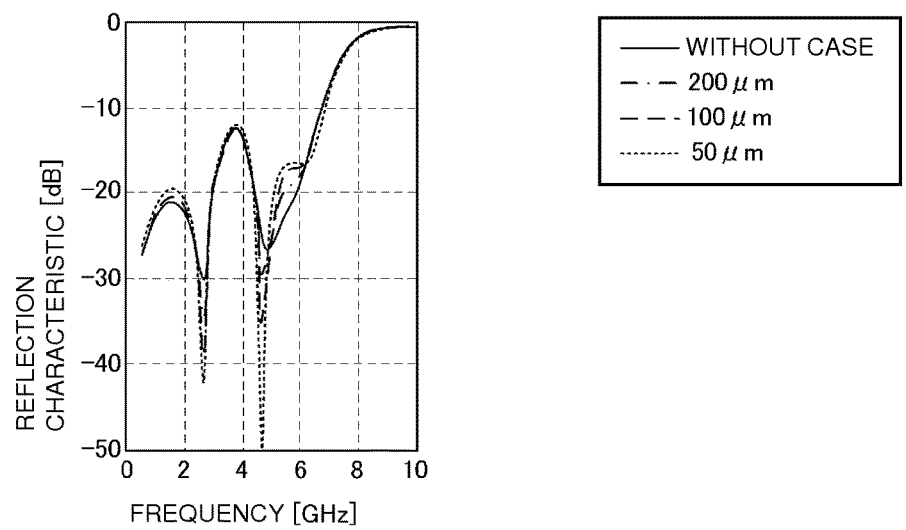

FIGS. 7A-7C show diagrams illustrating reflection characteristics of the splitter/combiner 20 of the radio-frequency module component 50. FIG. 7A illustrates the reflection characteristic of the low-band input/output terminal P2. FIG. 7B illustrates the reflection characteristic of the high-band input/output terminal P3. FIG. 7C illustrates the reflection characteristic of the common input/output terminal P1. The frequency used for evaluating the radio-frequency module component 50 is 500 MHz to 10 GHz, for example.

The solid line indicates the reflection characteristic in a case in which it is not necessary to consider the influence produced on the filter characteristic by the shield case 12 (corresponding to a case in which a shield case is not provided or the splitter/combiner 20 is sufficiently separated from the shield case 12). The long dashed dotted line indicates the reflection characteristic in a case in which the distance L (see FIGS. 6A and 6B) is about 200 μm, for example. The broken line indicates the reflection characteristic in a case in which the distance L is about 100 μm, for example. The dotted line indicates the reflection characteristic in a case in which the distance L is about 50 μm, for example. In FIG. 7A, the long dashed dotted line substantially coincides with the solid line and is thus omitted.

As the splitter/combiner 20 is closer to the shield case 12, the degree of deviation of the reflection characteristic of each terminal from the reflection characteristic when a shield case is not provided is greater. More specifically, the reflection characteristic of the high-band input/output terminal P3 shown in FIG. 7B with respect to the frequency about 5 GHz is considerably deteriorated. That is, when the side surface 32 of the multilayer body 30 opposes the shield case 12, the shield case 12 significantly influences the filter characteristic of the splitter/combiner 20.

Figure 8A:
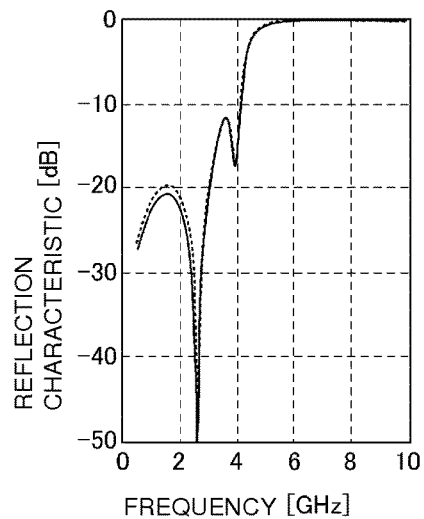
FIGS. 8A-8C are diagrams illustrating reflection characteristics of the splitter/combiner 20 of the radio-frequency module component 51.
Figure 8B:
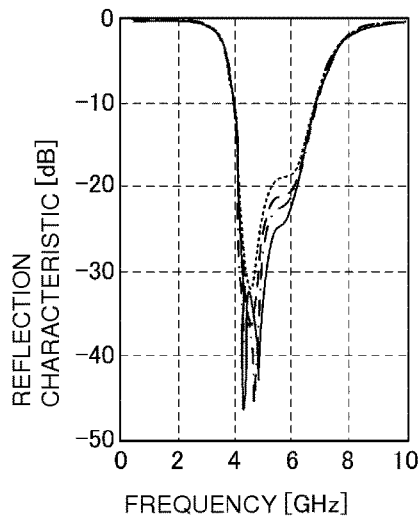
Figure 8C:
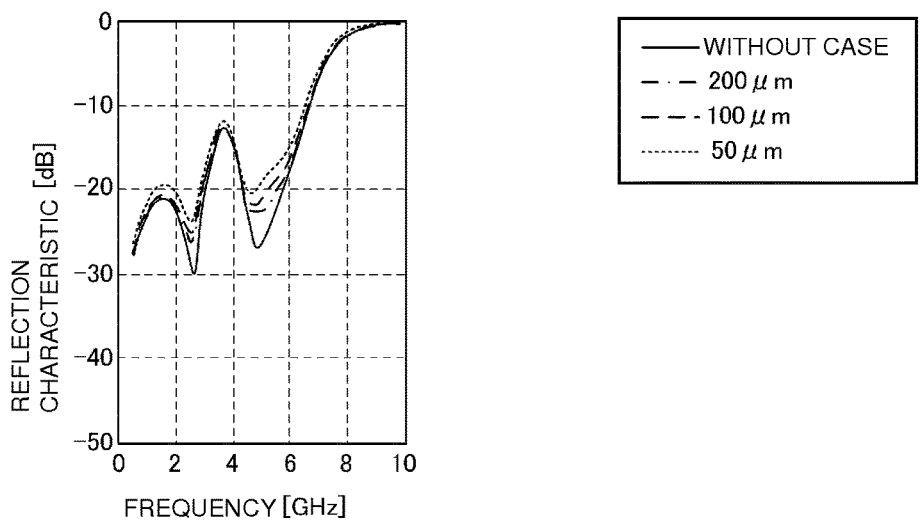

FIGS. 8A-8C show diagrams illustrating reflection characteristics of the splitter/combiner 20 of the radio-frequency module component 51. FIG. 8A illustrates the reflection characteristic of the low-band input/output terminal P2. FIG. 8B illustrates the reflection characteristic of the high-band input/output terminal P3. FIG. 8C illustrates the reflection characteristic of the common input/output terminal P1. In FIG. 8A, the long dashed dotted line and the broken line substantially coincide with the solid line and are thus omitted. The other points concerning FIGS. 8A-8C are similar to those of FIGS. 7A-7C.

As shown in FIG. 8A, almost no influence is produced on the reflection characteristic of the low-band input/output terminal P2 by the shield case 12. However, as shown in FIG. 8B and FIG. 8C, as the splitter/combiner 20 is closer to the shield case 12, the reflection characteristics of the high-band input/output terminal P3 and the common input/output terminal P1 farther deviate from the reflection characteristic when a shield case is not provided. More specifically, the reflection characteristic of the high-band input/output terminal P3 shown in FIG. 8B with respect to the frequency about 5 GHz is considerably deteriorated. That is, when the side surface 31 of the multilayer body 30 opposes the shield case 12, too, the shield case 12 significantly influences the filter characteristic of the splitter/combiner 20.

However, the amount by which the reflection characteristics of the radio-frequency module component 51 when the splitter/combiner 20 is located close to the shield case 12 are changed from the reflection characteristic when no shield case is provided is smaller than that of the radio-frequency module component 50. That is, the influence produced on the reflection characteristics of the radio-frequency module component 51 by the shield case 12 is smaller than that on the reflection characteristics of the radio-frequency module component 50.

Figure 9A:
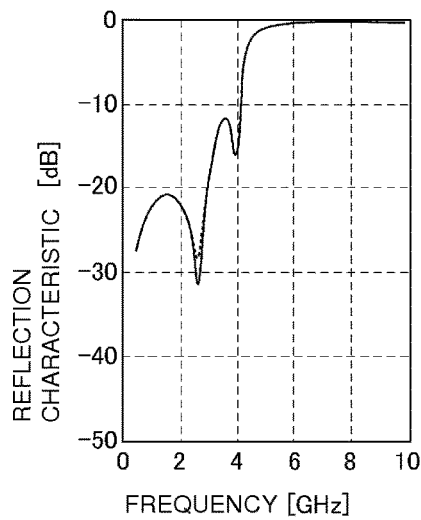
FIGS. 9A-9C are diagrams illustrating reflection characteristics of the splitter/combiner 20 of the radio-frequency module component 10.
Figure 9B:
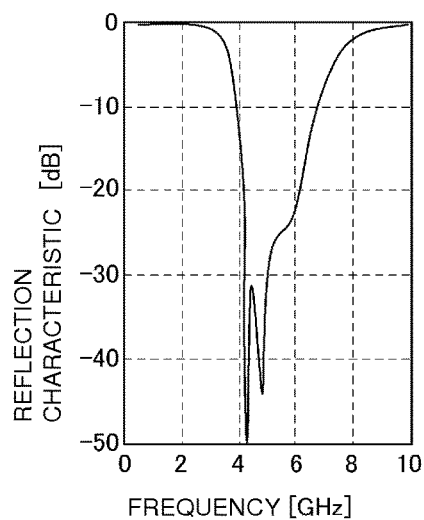
Figure 9C:
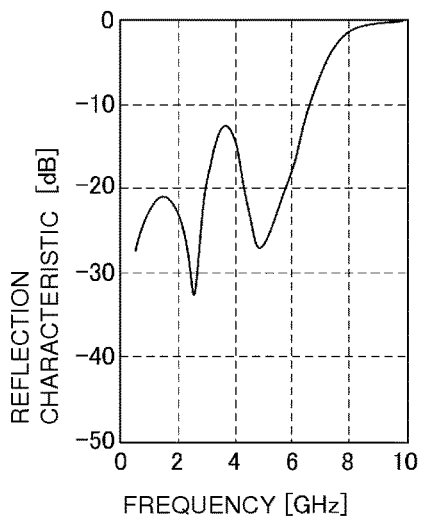

FIGS. 9A-9C show diagrams illustrating reflection characteristics of the splitter/combiner 20 of the radio-frequency module component 10 shown in FIG. 5A. FIG. 9A illustrates the reflection characteristic of the low-band input/output terminal P2. FIG. 9B illustrates the reflection characteristic of the high-band input/output terminal P3. FIG. 9C illustrates the reflection characteristic of the common input/output terminal P1. In FIG. 9A, the long dashed dotted line and the broken line substantially coincide with the solid line and are thus omitted. In FIG. 9B and FIG. 9C, the long dashed dotted line, the broken line, and the dotted line substantially coincide with the solid line and are thus omitted. The other points concerning FIGS. 9A-9C are similar to those of FIGS. 7A-7C.

Even when the splitter/combiner 20 is located close to the shield case 12, almost no change is observed in the reflection characteristic of each terminal from that when no shield case is provided. That is, when the side surface 33 of the multilayer body 30 opposes the shield case 12, almost no influence is produced on the filter characteristic of the splitter/combiner 20 by the shield case 12.

Figure 10A:
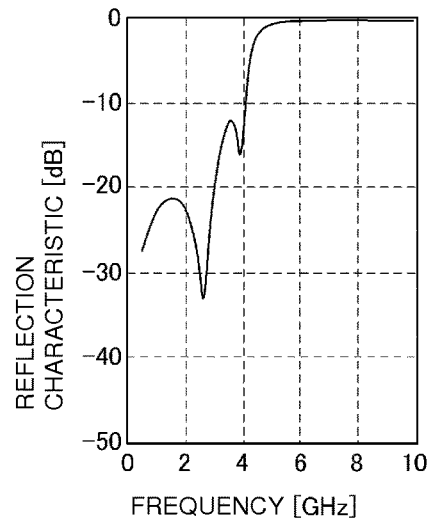
FIGS. 10A-10C are diagrams illustrating reflection characteristics of the splitter/combiner 20 of the radio-frequency module component 40.
Figure 10B:
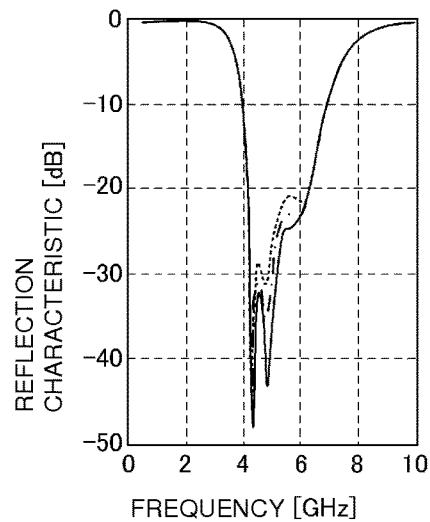
Figure 10C:
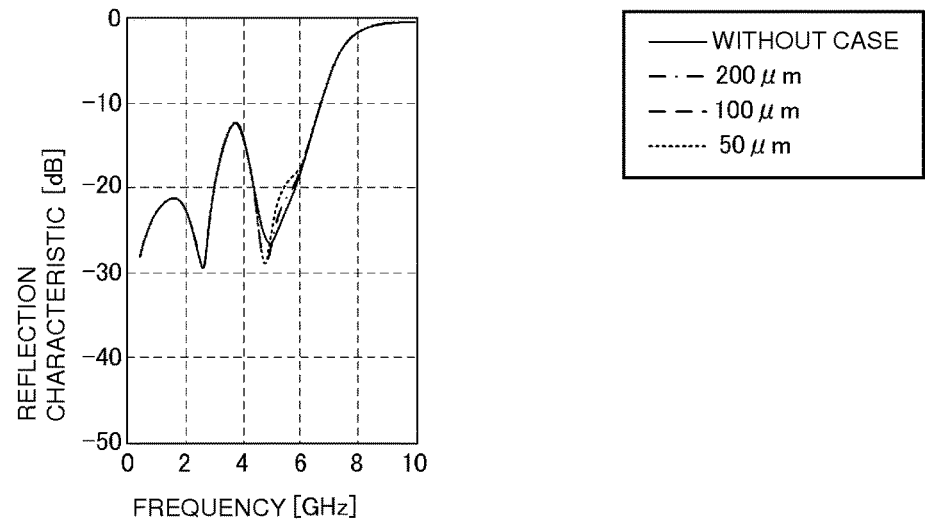

FIGS. 10A-10C are diagrams illustrating reflection characteristics of the splitter/combiner 20 of the radio-frequency module component 40 shown in FIG. 5B. FIG. 10A illustrates the reflection characteristic of the low-band input/output terminal P2. FIG. 10B illustrates the reflection characteristic of the high-band input/output terminal P3. FIG. 10C illustrates the reflection characteristic of the common input/output terminal P1. In FIG. 10A, the long dashed dotted line, the broken line, and the dotted line substantially coincide with the solid line and are thus omitted. In FIG. 10B and FIG. 10C, the broken line substantially coincides with the dotted line and is thus omitted. The other points concerning FIGS. 10A-10C are similar to those of FIGS. 7A-7C.

As shown in FIG. 10A and FIG. 10C, almost no influence is produced on the reflection characteristics of the low-band input/output terminal P2 and the common input/output terminal P1 by the shield case 12. As shown in FIG. 10B, when the splitter/combiner 20 is located close to the shield case 12, the reflection characteristic of the high-band input/output terminal P3 with respect to the frequency about 5 GHz somewhat deviates from that when no shield case is provided. However, the degree of deviation is within a range of about 2 dB to 4 dB and is thus smaller than that in FIG. 8B.

That is, when the side surface 34 of the multilayer body 30 opposes the shield case 12, the filter characteristic of the splitter/combiner 20 is not significantly influenced by the shield case 12.

Figure 11:
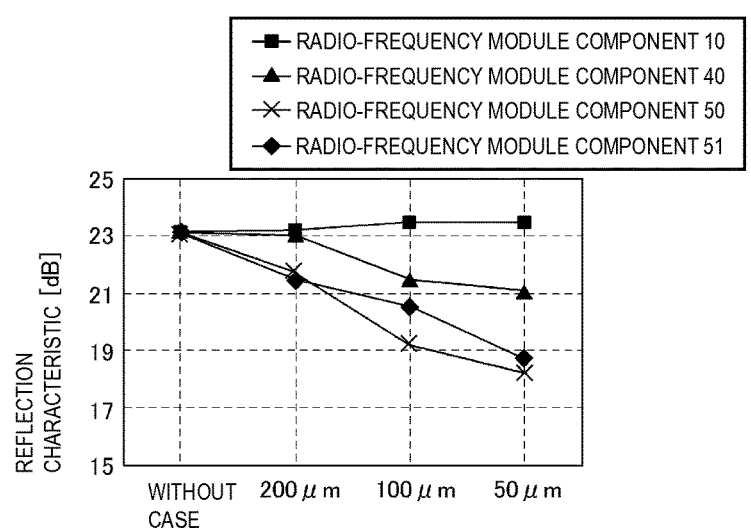
FIG. 11 is a diagram illustrating the absolute value of the reflection characteristic at the high-band input/output terminal P3.

FIG. 11 is a diagram illustrating the absolute value of the reflection characteristic when a 5-GHz radio-frequency signal is input into the high-band input/output terminal P3.

In the case of the radio-frequency module components 50 and 51, when the splitter/combiner 20 is located close to the shield case 12, the reflection characteristics of the high-band input/output terminal P3 are deteriorated. In the case of the radio-frequency module component 10, even when the splitter/combiner 20 is located close to the shield case 12, the degree of deterioration in the reflection characteristic of the high-band input/output terminal P3 is merely negligible.

In the case of the radio-frequency module component 40, when the distance L is about 200 μm, for example, the degree of deterioration in the reflection characteristic of the high-band input/output terminal P3 is merely negligible. When the splitter/combiner 20 is located closer to the shield case 12, the degree of deterioration in the reflection characteristic of the high-band input/output terminal P3 becomes higher than that of the radio-frequency module component 10, but is not as high as the degrees of deterioration of the radio-frequency module components 50 and 51.

Figure 12:
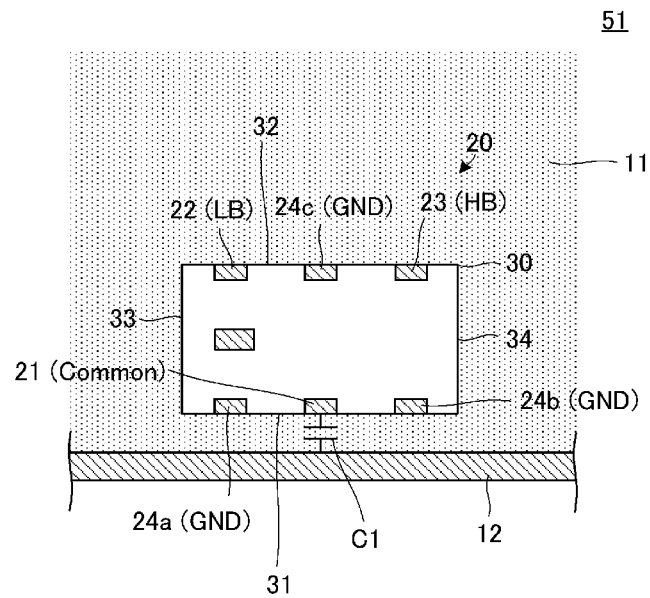
FIG. 12A is a conceptual diagram for explaining stray capacitance generated between the splitter/combiner 20 and the shield case 12 and FIG. 12B is an equivalent circuit diagram for explaining stray capacitance generated between the splitter/combiner 20 and the shield case 12.
Figure 12B:
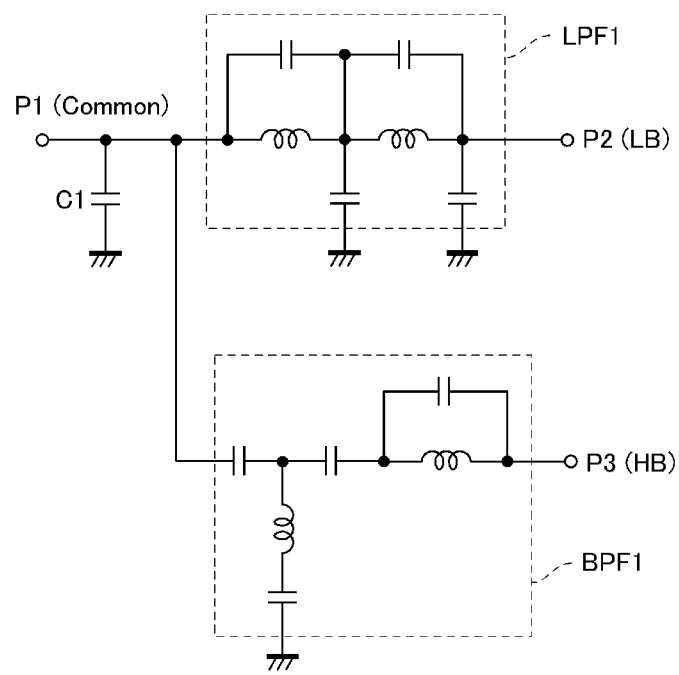

FIG. 12A is a conceptual diagram for explaining stray capacitance generated between the splitter/combiner 20 and the shield case 12. FIG. 12B is an equivalent circuit diagram for explaining stray capacitance generated between the splitter/combiner 20 and the shield case 12.

As shown in FIG. 12A, when the common input/output electrode 21 is located close to the shield case 12, stray capacitance C1 is generated therebetween. Since the shield case 12 is connected to a ground, stray capacitance C1 is generated between the common input/output terminal P1 and a ground, as shown in FIG. 10B. Accordingly, as shown in FIGS. 8A-8C and 11, when the common input/output electrode 21 is located close to the shield case 12, the filter characteristic of the splitter/combiner 20 is deteriorated.

Similarly, when the low-band input/output electrode 22 and the high-band input/output electrode 23 are located close to the shield case 12, stray capacitance is generated between the shield case 12 and each of the low-band input/output electrode 22 and the high-band input/output electrode 23. Accordingly, as shown in FIGS. 7A-7C and 11, the filter characteristic of the splitter/combiner 20 is deteriorated.

In contrast, when the side surface 33 or 34 of the multilayer body 30 opposes the side surface of the shield case in close proximity to each other, none of the common input/output electrode 21, the low-band input/output electrode 22, and the high-band input/output electrode 23 are close to the shield case 12. Accordingly, stray capacitance is less likely to be generated between the shield case 12 and each of the common input/output electrode 21, the low-band input/output electrode 22, and the high-band input/output electrode 23. As a result, as shown in FIGS. 9A-11, even when the splitter/combiner 20 is located close to the shield case 12, the degree of deterioration in the filter characteristic of the splitter/combiner 20 is merely negligible.

Figure 13:
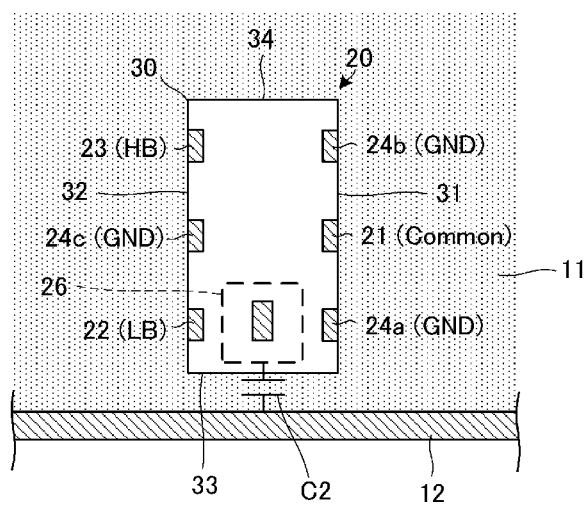
FIG. 13 is a conceptual diagram for explaining stray capacitance generated between the splitter/combiner 20 and the shield case 12.

FIG. 13 is a conceptual diagram for explaining stray capacitance generated between the splitter/combiner 20 and the shield case 12. When the side surface 33 of the multilayer body 30 opposes the side surface of the shield case 12 in close proximity to each other, stray capacitance is less likely to be generated between outer electrodes, such as the common input/output electrode 21, and the shield case 12, as discussed above. Even in this case, however, stray capacitance C2 is generated between an electrode pattern 26 (electrode pattern forming the low-pass filter LPF1) within the multilayer body 30 and the shield case 12, as shown in FIG. 13.

As shown in FIG. 4, at a portion near the side surface 33 of the multilayer body 30, electrode patterns of the low-pass filter LPF1 are principally provided. Thus, stray capacitance C2 is generated between the electrode patterns of the low-pass filter LPF1 and the shield case 12. As a result, stray capacitance connected to a ground is generated within the low-pass filter LPF1.

Similarly, when the side surface 34 of the multilayer body 30 opposes the side surface of the shield case 12 in close proximity to each other, stray capacitance connected to a ground is provided within the band pass filter BPF1.

The low-pass filter LPF1 is designed to allow a low-band radio-frequency signal to pass therethrough. The band pass filter BPF1 is designed to allow a high-band radio-frequency signal to pass therethrough. Thus, the device values of the capacitors and inductors of the low-pass filter LPF1 are greater than those of the band pass filter BPF1. Accordingly, with the same amount of stray capacitance, the band pass filter BPF1 is more vulnerable than the low-pass filter LPF1.

Thus, when the side surface 34 of the multilayer body 30 opposes the side surface of the shield case 12 in close proximity to each other, the filter characteristic of the splitter/combiner 20 is deteriorated more significantly than when the side surface 33 of the multilayer body 30 opposes the side surface of the shield case 12 in close proximity to each other. That is, as shown in FIGS. 9A through 11, the filter characteristic of the radio-frequency module component 40 is deteriorated more significantly than that of the radio-frequency module component 10.

Figure 14:
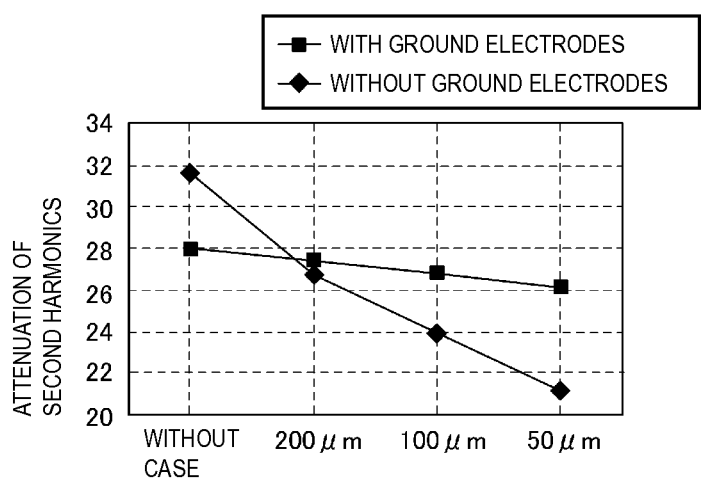
FIG. 14 is a diagram illustrating the absolute value of the attenuation of second harmonics in a low-pass filter LPF1.

FIG. 14 is a diagram illustrating the absolute value of the attenuation of second harmonics (10 GHz) in the low-pass filter LPF1 upon input of a 5-GHz radio-frequency signal according to whether or not the ground electrodes 25 are provided. In this case, the side surface 34 of the multilayer body 30 opposes the side surface of the shield case 12 in close proximity to each other, as shown in FIG. 5B.

In a case in which the ground electrodes 25 shown in FIG. 4 are not provided, as the splitter/combiner 20 is located closer to the shield case 12, second harmonics eliminated by the low-pass filter LPF1 are decreased. That is, as the splitter/combiner 20 is located closer to the shield case 12, the filter characteristic of the low-pass filter LPF1 is deteriorated more significantly.

In contrast, in a case in which the ground electrodes 25 are provided, even when the splitter/combiner 20 is located close to the shield case 12, second harmonics eliminated by the low-pass filter LPF1 are not considerably decreased. That is, even when the splitter/combiner 20 is located close to the shield case 12, the filter characteristic of the low-pass filter LPF1 is not significantly deteriorated.

Figure 15:
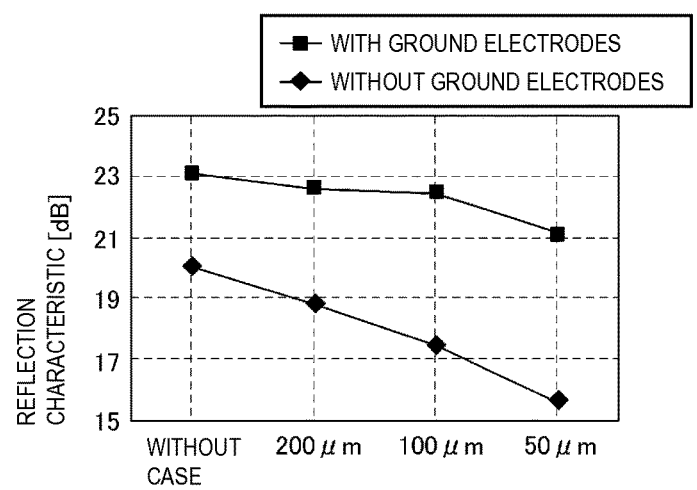
FIG. 15 is a diagram illustrating the absolute value of the reflection characteristic at a high-band input/output terminal P3.

FIG. 15 is a diagram illustrating the absolute value of the reflection characteristic at the high-band input/output terminal P3 upon input of a 5-GHz radio-frequency signal according to whether or not the ground electrodes 25 are formed, as in the case in FIG. 14. The other points concerning FIG. 15 are similar to those of FIG. 14. In a case in which the ground electrodes 25 are not formed, as the splitter/combiner 20 is located closer to the shield case 12, the reflection characteristic of the high-band input/output terminal P3 is deteriorated. In contrast, in a case in which the ground electrodes 25 are formed, even when the splitter/combiner 20 is located closer to the shield case 12, the reflection characteristic of the high-band input/output terminal P3 is not significantly deteriorated.

In this manner, by forming the ground electrodes 25 near the top surface 35 of the multilayer substrate 30, the formation of stray capacitance between an electrode pattern within the splitter/combiner 20 and the shield case 12 is suppressed. By forming the ground electrodes 25 on and near the bottom surface 36 of the multilayer substrate 30, the formation of stray capacitance between an electrode pattern within the splitter/combiner 20 and the ground electrodes formed on the substrate 11 is suppressed. It is thus possible to suppress the deterioration in the filter characteristic of the splitter/combiner 20, compared with a case in which the ground electrodes 25 are not formed.

Second Preferred Embodiment

Figure 16:
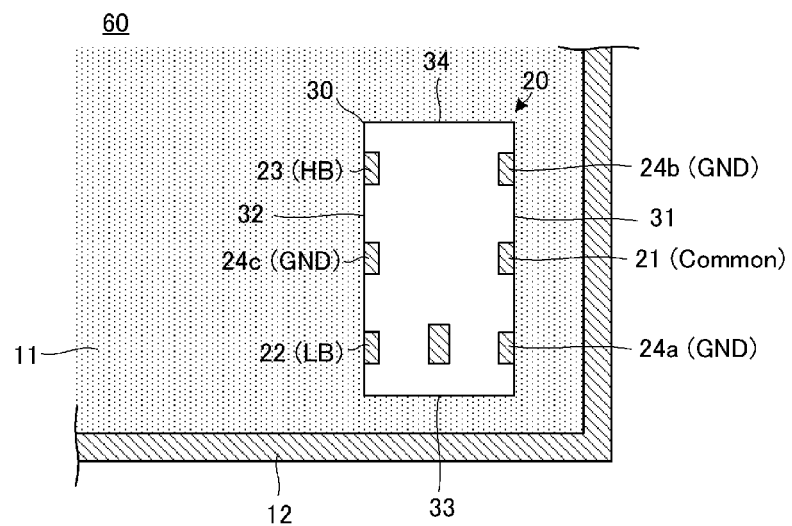
FIG. 16A is a sectional plan view of the major portion of a radio-frequency module component 60 and FIG. 16B is a sectional plan view of the major portion of a radio-frequency module component 70.

A radio-frequency module component 60 according to a second preferred embodiment of the present invention will be described below. FIG. 16A is a sectional plan view of the major portion of the radio-frequency module component 60. The splitter/combiner 20 is disposed at a corner of the substrate 11 such that the side surfaces 31 and 33 of the multilayer body 30 are located along the edges of the substrate 11. The side surfaces of the shield case 12 are disposed along the edges of the substrate 11 and bend at right angles at the corners of the substrate 11, as viewed from above.

The side surface 33 of the multilayer body 30 opposes a side surface of the shield case 12 in the closest proximity to each other. The side surface 31 of the multilayer body 30 opposes another side surface of the shield case 12 in the second closest proximity to each other. No elements are disposed between the side surfaces of the shield case 12 and the side surfaces 31 and 33.

The configuration of the radio-frequency module component 60 other than the above-described points is similar to that of the first preferred embodiment.

Figure 16B:
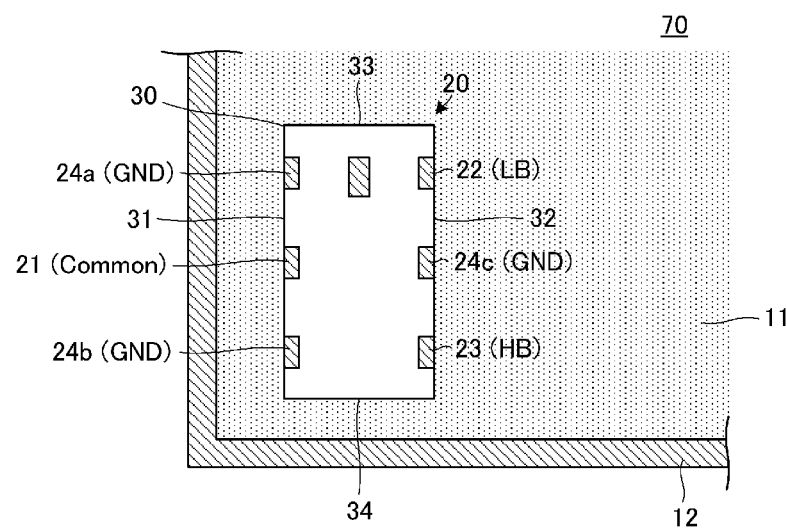

The splitter/combiner 20 may be disposed in a manner as in a radio-frequency module component 70. FIG. 16B is a sectional plan view of a major portion of the radio-frequency module component 70. The splitter/combiner 20 is disposed at a corner of the substrate 11 such that the side surfaces 31 and 34 of the multilayer body 30 are located along the edges of the substrate 11. The side surface 34 of the multilayer body 30 opposes a side surface of the shield case 12 in the closest proximity to each other. The side surface 31 of the multilayer body 30 opposes another side surface of the shield case 12 in the second closest proximity to each other. No elements are disposed between the side surfaces of the shield case 12 and the side surfaces 31 and 34. The configuration of the radio-frequency module component 70 other than the above-described points is similar to that of the radio-frequency module component 60.

In the second preferred embodiment, the common input/output electrode 21 opposes the shield case 12 in close proximity to each other. Accordingly, stray capacitance is generated between the common input/output electrode 21 and the shield case 12. However, as shown in FIGS. 7A-7C, 8A-8C, and 11, when the side surface 31 opposes the shield case 12, the filter characteristic of the splitter/combiner 20 is not deteriorated as much as when the side surface 32 opposes the shield case 12. Additionally, the distance from the side surface 31 to the shield case 12 is greater than that from the side surface 33 or 34 to the shield case 12. Because of this reason, in the second preferred embodiment, too, it is possible to significantly reduce or prevent the deterioration in the filter characteristic of the splitter/combiner 20 caused by the shield case 12.

Other advantages of the first preferred embodiment are obtained similarly.

As shown in FIG. 11, if the side surface 31 is separated from the side surface of the shield case 12 by about 200 µm or greater, for example, the influence produced on the splitter/combiner 20 by the shield case 12 is decreased. Accordingly, in the radio-frequency module components 60 and 70, it is preferable that the side surface 31 oppose a side surface of the shield case 12 such that they are separated from each other by about 200 µm or greater, for example.

If an antenna terminal (not shown) is provided at a corner, since the common input/output electrode 21 is located at a corner of the substrate 11, it becomes easy to design the distance between the common input/output electrode 21 and the outer output electrode 15a (see FIG. 1) connected to an antenna to be small. Accordingly, the length of the wiring pattern that connects the common input/output electrode 21 and the outer output electrode 15a is able to be reduced, thus making it possible to decrease the transmission loss incurred in this wiring pattern.

By utilizing stray capacitance generated between the common input/output electrode 21 and the shield case 12, a matching circuit that matches the radio-frequency module components 60 and 70 to the antenna (see FIG. 1) is able to be designed.

Third Preferred Embodiment

Figure 17:
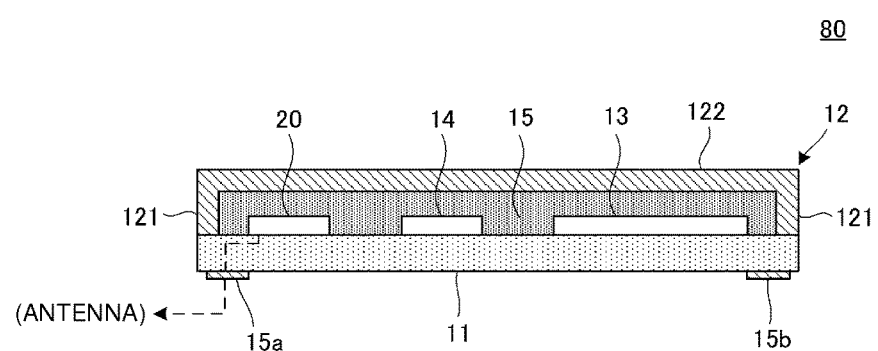
FIG. 17 is a side sectional view of the major portion of a radio-frequency module component 80.

A radio-frequency module component 80 according to a third preferred embodiment of the present invention will be described below. FIG. 17 is a side sectional view of the major portion of the radio-frequency module component 80. A resin 15 fills a hollow portion defined by the substrate 11 and the shield case 12. That is, the resin 15 covers the surface of the substrate 11, and the shield case 12 covers the surface of the resin 15. The shield case 12 may be formed by the application of a conductive paste to the surface of the resin 15, for example. Alternatively, the shield case 12 using a conductive paste may be formed within the resin 15, for example.

The electrostatic capacitance is proportional to the dielectric constant of a dielectric which fills a portion between opposing electrodes. The dielectric constant of resin is higher than that of air. Accordingly, if a resin fills a portion between the splitter/combiner 20 and the shield case 12, stray capacitance generated between the shield case 12 and each of the electrodes of the splitter/combiner 20 is increased. In the third preferred embodiment, the generation of stray capacitance is significantly reduced or prevented in a manner similar to the first preferred embodiment. Thus, the advantages of various preferred embodiments of the present invention are more noticeable.

Advantages similar to the first preferred embodiment are also obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module component comprising:
    a splitter/combiner including a multilayer body that includes a plurality of insulating layers and electrode patterns stacked on each other in a stacking direction, first, second, third and fourth side surfaces, a common input/output electrode, an individual input/output electrode, and an outer ground electrode on a bottom surface of the splitter/combiner; and a shield case containing the splitter/combiner; wherein the first side surface and the second side surface oppose each other;

the common input/output electrode is disposed at an edge of the first side surface on the bottom surface;

the individual input/output electrode is disposed at an edge of the second side surface on the bottom surface; and among the first, second, third and fourth side surfaces, the third side surface or the fourth side surface opposes a side surface of the shield case in closest proximity to each other.

2. The radio-frequency module component according to claim 1, wherein the individual input/output electrode includes a low-band input/output electrode and a high-band input/output electrode;

the low-band input/output electrode is disposed near the third side surface;

the high-band input/output electrode is disposed near the fourth side surface;

the splitter/combiner includes a low-band filter circuit and a high-band filter circuit within the multilayer body;

the low-band filter circuit is disposed near the third side surface and is connected between the common input/output electrode and the low-band input/output electrode;

the high-band filter circuit is disposed near the fourth side surface and is connected between the common input/output electrode and the high-band input/output electrode; and among the first, second, third and fourth side surfaces, the third side surface opposes a side surface of the shield case in closest proximity to each other.

3. The radio-frequency module component according to claim 2, wherein the common input/output electrode, the low-band input/output electrode and the high-band input/output electrode extend from the top surface along the first or second side surfaces to the bottom surface.

4. The radio-frequency module component according to claim 2, wherein the common input/output electrode, the low-band input/output electrode and the high-band input/output electrode are located on the bottom surface.

5. The radio-frequency module component according to claim 1, further comprising:

a substrate with a rectangular or substantially rectangular flat shape to mount the splitter/combiner thereon; wherein side surfaces of the shield case are disposed along edges of the substrate;

the splitter/combiner is disposed at one of four corners of the substrate; and the first side surface opposes a second side surface of the shield case in closer proximity than the second side surface opposes a third side surface of the shield case.

6. The radio-frequency module component according to claim 5, wherein the first side surface opposes the second side surface of the shield case such that the first side surface is separated from the second side surface of the shield case by about 200 µm or greater.

7. The radio-frequency module component according to claim 1, wherein the common input/output electrode extends from the bottom surface to the first side surface, and the outer ground electrode extends from the bottom surface to one of the first through fourth side surfaces.

8. The radio-frequency module component according to claim 1, wherein a resin fills a portion between the splitter/combiner and the shield case; and the shield case is made of a metal.

9. The radio-frequency module component according to claim 1, further comprising a radio frequency integrated circuit and a radio frequency element that is one of a switch integrated circuit, a power amplifier and a filter.

10. The radio-frequency module component according to claim 1, wherein the splitter/combiner is connected to an antenna.

11. The radio-frequency module component according to claim 1, wherein the splitter/combiner includes a low-pass filter circuit and a band pass filter circuit within the multiplayer body; and electrode patterns of the low-pass filter circuit do not overlap electrode patterns of the band pass filter circuit as viewed from the stacking direction.

12. The radio-frequency module component according to claim 1, wherein the electrode patterns include linear electrode patterns and planar electrode patterns; and the linear electrode patterns defining inductors are provided on the top surface and the planar electrode patterns defining capacitors are provided on the bottom surface.

13. The radio-frequency module component according to claim 1, wherein ground electrodes disposed in the multilayer body are located near a topmost layer and a bottommost layer of the plurality of insulating layers.

14. A wireless communication device comprising:

a radio-frequency module including:

a splitter/combiner including a multilayer body that includes a plurality of insulating layers and electrode patterns stacked on each other in a stacking direction, first, second, third and fourth side surfaces, a common input/output electrode, an individual input/output electrode, and an outer ground electrode on a bottom surface of the splitter/combiner; and a shield case containing the splitter/combiner; wherein the first side surface and the second side surface oppose each other;

the common input/output electrode is disposed at an edge of the first side surface on the bottom surface;

the individual input/output electrode is disposed at an edge of the second side surface on the bottom surface; and among the first, second, third and fourth side surfaces, the third side surface or the fourth side surface opposes a side surface of the shield case in closest proximity to each other.

15. The wireless communication device according to claim 14, wherein the individual input/output electrode includes a low-band input/output electrode and a high-band input/output electrode;

the low-band input/output electrode is disposed near the third side surface;

the high-band input/output electrode is disposed near the fourth side surface;

the splitter/combiner includes a low-band filter circuit and a high-band filter circuit within the multilayer body;

the low-band filter circuit is disposed near the third side surface and is connected between the common input/output electrode and the low-band input/output electrode;

the high-band filter circuit is disposed near the fourth side surface and is connected between the common input/output electrode and the high-band input/output electrode; and among the first, second, third and fourth side surfaces, the third side surface opposes a side surface of the shield case in closest proximity to each other.

16. The wireless communication device according to claim 14, the radio-frequency module further comprises:

a substrate with a rectangular or substantially rectangular flat shape to mount the splitter/combiner thereon; wherein side surfaces of the shield case are disposed along edges of the substrate;

the splitter/combiner is disposed at one of four corners of the substrate; and the first side surface opposes a second side surface of the shield case in closer proximity than the second side surface opposes a third side surface of the shield case.

17. The wireless communication device according to claim 16, wherein the first side surface opposes the second side surface of the shield case such that the first side surface is separated from the second side surface of the shield case by about 200 µm or greater.

18. The wireless communication device according to claim 14, wherein the common input/output electrode extends from the bottom surface to the first side surface, and the outer ground electrode extends from the bottom surface to one of the first through fourth side surfaces.

19. The wireless communication device according to claim 14, wherein a resin fills a portion between the splitter/combiner and the shield case; and the shield case is made of a metal.

20. The wireless communication device according to claim 14, wherein the radio-frequency module further comprises a radio frequency integrated circuit and a radio frequency element that is one of a switch integrated circuit, a power amplifier and a filter.

* * * * *